(12) United States Patent
Huang et al.

(10) Patent No.: US 12,300,552 B2
(45) Date of Patent: May 13, 2025

(54) PROCESS CONTROL SYSTEM INCLUDING PROCESS CONDITION DETERMINATION USING ATTRIBUTE-RELATIVE PROCESS CONDITION

(71) Applicant: TEXAS INSTRUMENTS INCORPORATED, Dallas, TX (US)

(72) Inventors: Shuqian Huang, Chengdu (CN); Sheng Zou, Chengdu (CN); Yuchen Li, Chengdu (CN); Peng Li, Chengdu (CN); Chao Zhuang, Chengdu (CN); Zhiyun Liu, Chengdu (CN)

(73) Assignee: Texas Instruments Incorporated, Dallas, TX (US)

( * ) Notice: Subject to any disclaimer, the term of this patent is extended or adjusted under 35 U.S.C. 154(b) by 570 days.

(21) Appl. No.: 17/736,549

(22) Filed: May 4, 2022

(65) Prior Publication Data

US 2023/0238291 A1 Jul. 27, 2023

Related U.S. Application Data

(60) Provisional application No. 63/302,405, filed on Jan. 24, 2022.

(51) Int. Cl.
*H01L 21/66* (2006.01)
*G05B 19/418* (2006.01)

(52) U.S. Cl.
CPC .......... *H01L 22/20* (2013.01); *G05B 19/4185* (2013.01); *G05B 2219/40066* (2013.01)

(58) Field of Classification Search
CPC ..... H01L 22/20; H01L 22/12; G05B 19/4185; G05B 2219/40066; G05B 2219/32196; G05B 19/41875
See application file for complete search history.

(56) References Cited

U.S. PATENT DOCUMENTS

| | | | |
|---|---|---|---|
| 2005/0209818 A1* | 9/2005 | Chao | G03F 7/70525 702/182 |
| 2006/0025935 A1* | 2/2006 | Shen | H01L 22/20 702/30 |
| 2022/0187786 A1* | 6/2022 | Hauptmann | G03F 7/70633 |
| 2022/0334500 A1* | 10/2022 | Yagubizade | G03F 7/70633 |

* cited by examiner

*Primary Examiner* — Rami R Okasha
(74) *Attorney, Agent, or Firm* — Andrew R. Ralston; Frank D. Cimino

(57) ABSTRACT

The present disclosure generally relates to determining a process condition in a semiconductor process using attribute-relative process conditions. An example is a method of forming an integrated circuit (IC). First and second historical process conditions are obtained. The first historical process conditions are of previous semiconductor processing corresponding to a target value of a process attribute for forming the IC, and the second historical process conditions are of previous semiconductor processing corresponding to variable values of the process attribute. Attribute-relative process conditions are calculated. Each attribute-relative process condition is based on the first historical process conditions and the second historical process conditions that correspond to a respective given value of the variable values. An average process condition is determined from a subset of the attribute-relative process conditions. A process condition of a subsequent semiconductor process is set based on the average process condition.

20 Claims, 6 Drawing Sheets

FIG. 4
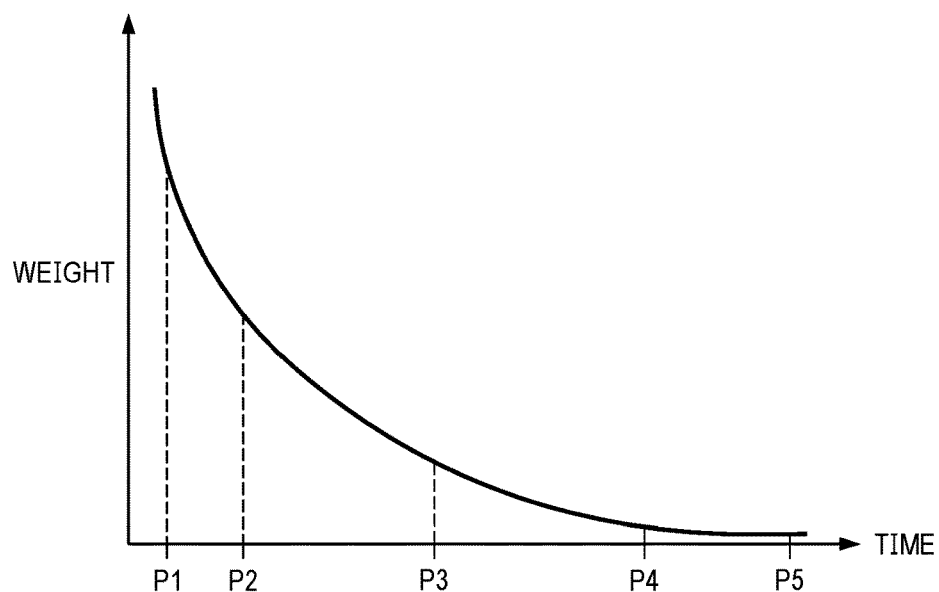
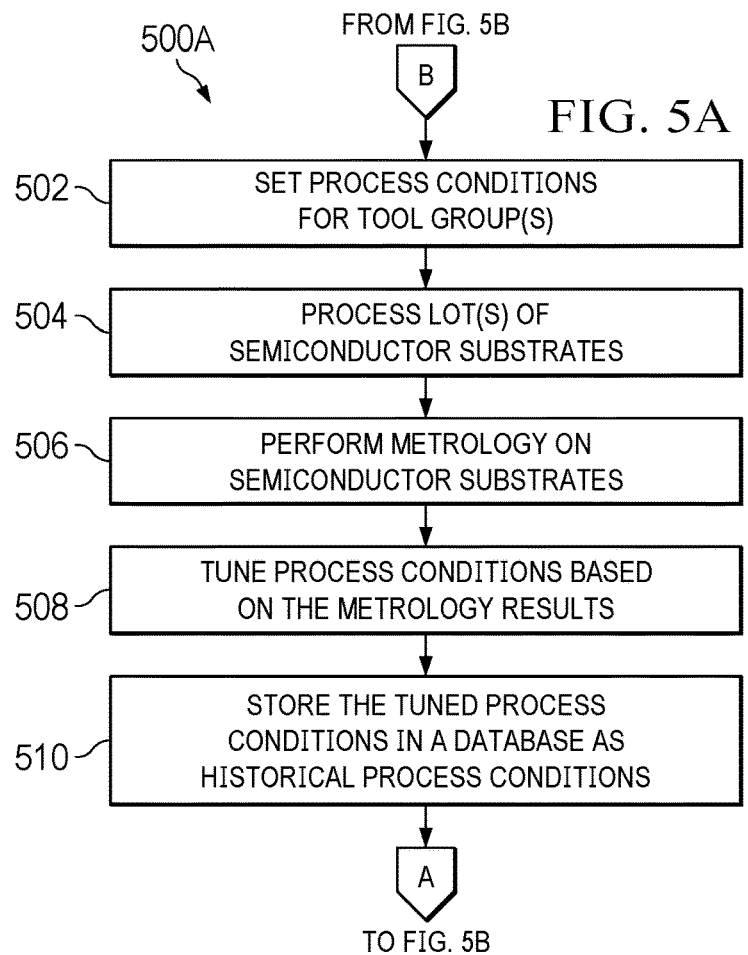
FIG. 5A

PROCESS CONTROL SYSTEM INCLUDING PROCESS CONDITION DETERMINATION USING ATTRIBUTE-RELATIVE PROCESS CONDITION

CROSS-REFERENCE TO RELATED APPLICATIONS

This application claims priority to and the benefit of U.S. Provisional Patent Application Ser. No. 63/302,405, filed on Jan. 24, 2022, which is hereby incorporated herein by reference in its entirety.

BACKGROUND

Semiconductor processing includes multiple processing steps to fabricate electronic devices, such as integrated circuits. Variation in semiconductor processing can lead to variation in the fabricated electronic devices, which can result in reduced yield in the fabricated electronic devices. Advanced Process Control (APC) in semiconductor processing is continuously being researched and developed to improve semiconductor processing. However, even with APC, yield of electronic devices fabricated by semiconductor processing may not be satisfactory.

SUMMARY

This Summary is provided to introduce a brief selection of disclosed concepts in a simplified form that are further described below in the Detailed Description including the drawings provided. Various disclosed systems and methods may be beneficially applied to semiconductor processing wherein a process condition is determined using attribute-relative process conditions. While such implementations may be expected to decrease variation in fabricated end-devices, among other things, no particular result, advantage, or benefit is a requirement unless explicitly recited in a particular claim.

An example described herein is a method of forming an integrated circuit (IC). Using one or more processor-based systems, first historical process conditions and second historical process conditions are obtained. The first historical process conditions are of previous semiconductor processing corresponding to a target value of a process attribute for forming the IC, and the second historical process conditions are of previous semiconductor processing corresponding to variable values of the process attribute. Using the one or more processor-based systems, attribute-relative process conditions are calculated. Each attribute-relative process condition of the attribute-relative process conditions is based on the first historical process conditions and the second historical process conditions that correspond to a respective given value of the variable values. Using the one or more processor-based systems, an average process condition is determined from a subset of the attribute-relative process conditions. A process condition of a subsequent semiconductor process is set based on the average process condition. The subsequent semiconductor process corresponding to the target value of the process attribute. The subsequent semiconductor process is performed on a semiconductor substrate. The subsequent semiconductor process being based on the set process condition.

Another example is a method of forming an integrated circuit. Using one or more processor-based systems, first historical energy conditions and second historical energy conditions are obtained. The first historical energy conditions are of previous photolithography processing corresponding to a target value of a process attribute, and the second historical energy conditions are of previous photolithography processing corresponding to variable values of the process attribute. Using the one or more processor-based systems, time-based weights are determined. Each time-based weight of the time-based weights is for a time-corresponding pair of a first historical energy condition of the first historical energy conditions and a second historical energy condition of the second historical energy conditions. Using the one or more processor-based systems, attribute-relative energy conditions are calculated. Each attribute-relative energy condition of the attribute-relative energy conditions is based on the time-based weights, the first historical energy conditions, and the second historical energy conditions that correspond to a respective given value of the variable values of the process attribute. Using the one or more processor-based systems, outlier attribute-relative energy conditions of the attribute-relative energy conditions are excluded. Using the one or more processor-based systems, an average energy condition is determined from non-excluded attribute-relative energy conditions of the attribute-relative energy conditions. An energy condition of a subsequent photolithography process is set based on the average energy condition. The subsequent photolithography process corresponding to the target value of the process attribute. The subsequent photolithography process is performed on a semiconductor substrate. The subsequent photolithography process is based on the set energy condition.

A further example is a non-transitory computer readable medium including stored instructions. The stored instructions, when executed by one or more processors, cause the one or more processors to obtain first historical process conditions and second historical process conditions from a database, determine time-based weights, calculate attribute-relative process conditions, exclude outlier attribute-relative process conditions of the attribute-relative process conditions, and determine an average process condition from non-excluded attribute-relative process conditions of the attribute-relative process conditions. The first historical process conditions are of previous semiconductor processing corresponding to a target value of a process attribute, and the second historical process conditions are of previous semiconductor processing corresponding to variable values of the process attribute. Each time-based weight of the time-based weights is for a time-corresponding pair of a first historical process condition of the first historical process conditions and a second historical process condition of the second historical process conditions. Each attribute-relative process condition of the attribute-relative process conditions is a current process condition corresponding to a respective given value of the variable values of the process attribute plus a sum of weighted differences. Each weighted difference of the weighted differences being a respective time-based weight of the time-based weights times a difference between a respective time-corresponding pair of the time-corresponding pairs. For the respective time-corresponding pair, the second historical process condition corresponds to the respective given value of the variable values of the process attribute. The average process condition is for a subsequent semiconductor process corresponding to the target value of the process attribute.

The foregoing summary outlines rather broadly various features of examples of the present disclosure in order that the following detailed description may be better understood. Additional features and advantages of such examples will be described hereinafter. The described examples may be readily utilized as a basis for modifying or designing other examples that are within the scope of the appended claims.

BRIEF DESCRIPTION OF THE DRAWINGS

So that the manner in which the above recited features can be understood in detail, reference is made to the following detailed description taken in conjunction with the accompanying drawings.

FIG. 4 is a graph illustrating example time-based weights for time periods according to some examples.

FIGS. 5A and 5B are a flow chart for updating process conditions for forming ICs according to some examples.

Figure 1:
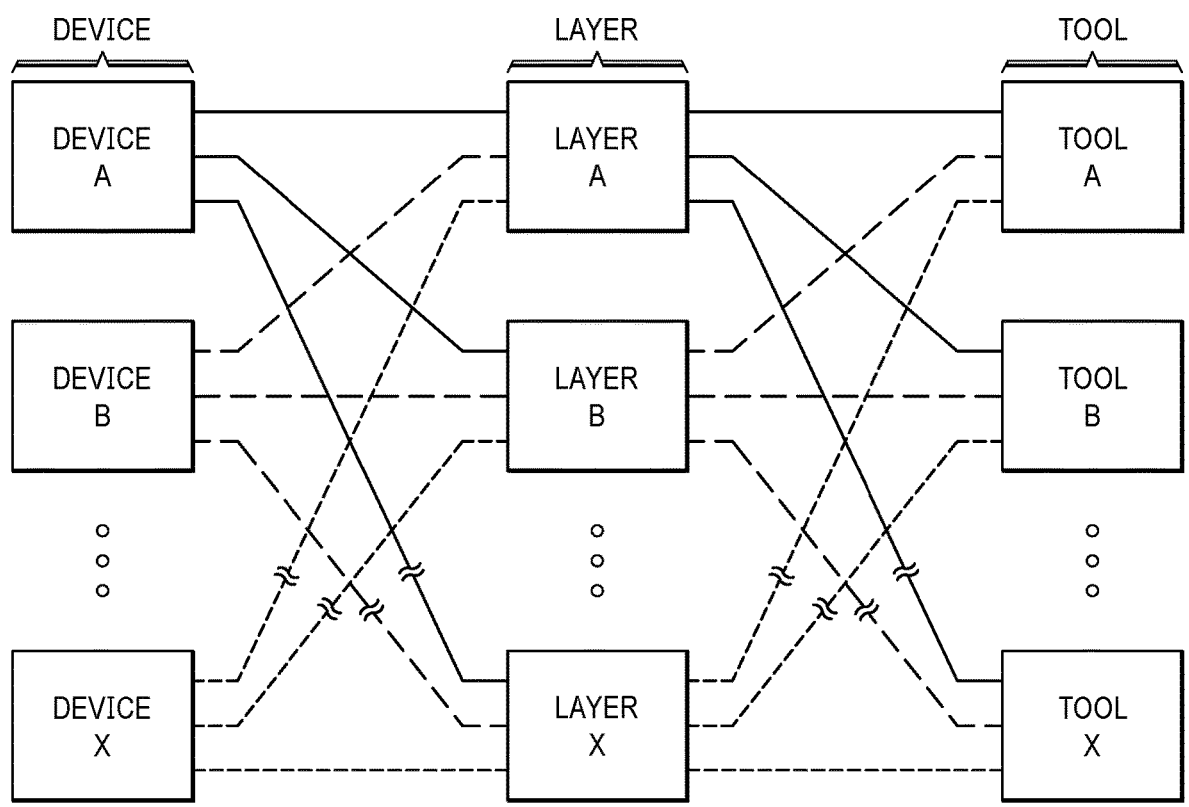
FIG. 1 diagrammatically illustrates routing of layers of types of end-devices to different tool groups according to some examples.

The drawings, and accompanying detailed description, are provided for understanding of features of various examples and do not limit the scope of the appended claims. The examples illustrated in the drawings and described in the accompanying detailed description may be readily utilized as a basis for modifying or designing other examples that are within the scope of the appended claims. Identical reference numerals may be used, where possible, to designate identical elements that are common among drawings. The figures are drawn to clearly illustrate the relevant elements or features and are not necessarily drawn to scale.

DETAILED DESCRIPTION

Various features are described hereinafter with reference to the figures. An illustrated example may not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations.

The present disclosure relates generally, but not exclusively, to determining a process condition in a semiconductor process for forming an integrated circuit (IC) using attribute-relative process conditions. Examples described herein calculate attribute-relative process conditions. A subset of the attribute-relative process conditions is used to determine an average process condition. In some examples, outliers of the attribute-relative process conditions are excluded, and an average of the non-excluded attribute-relative process conditions is calculated to determine the average process condition. The average process condition is used to set the process condition of the semiconductor process. In some specific examples described below, the semiconductor process is a photolithography process, and the process condition is an energy condition. In such examples, the attribute-relative process conditions can be calculated relative to different types of end-devices to be fabricated, different layers formed on a semiconductor substrate, and/or different tools used in the photolithography processes.

In semiconductor processing, photolithography is a process used to form various structures in, on, or over a semiconductor substrate (e.g., wafer). The photolithography process generally includes coating a top material layer of a photo-sensitive material (e.g., a photoresist) over the semiconductor substrate, exposing the photo-sensitive material to electromagnetic radiation (e.g., ultraviolet light) through a mask having a target pattern, and developing the photo-sensitive material. The target pattern is transferred to the photo-sensitive material by the exposure and development either in the form of remaining photo-sensitive material (e.g., a positive photoresist) or by removed photo-sensitive material (e.g., a negative photoresist). The remaining photo-sensitive material with the transferred pattern can then be used as a mask for a subsequent process, such as for etching the top material layer to transfer the target pattern to that layer, or for an additive process (e.g., plating) to form a structure having the inverse of the pattern of the photo-sensitive material.

The energy condition of an exposure can affect the pattern transferred into the photo-sensitive material. The energy condition can include the energy of the exposure transferred to the photo-sensitive material, which can be affected by the power or intensity of the electromagnetic radiation of the exposure and the duration of the exposure. The energy of the exposure can affect the boundaries of the transferred pattern (e.g., more energy can result in wider line patterns), which can also affect an amount of undesirable overlay of the pattern relative to an underlying or previous layer. As an example of undesirable overlay, if the energy of the exposure causes wider patterns (e.g., for metal vias) that are out-of-spec, the wider patterns may undesirably contact or interfere with other structures, which, in some instances, can cause electrical shorts. With usage, over time a stepper/exposure tool in which exposures occur can have the energy condition of exposures drift or vary. The varying energy conditions can result in patterns being formed in a photo-sensitive material that vary from a target pattern of the exposure. Extensive variation from the target pattern can render end-devices that are to be fabricated in part by the exposure to be out-of-spec or nonfunctional, and thus, yield of the end-devices can decrease as a result of such variation.

Addressing variation of the energy condition can be difficult. Modern semiconductor fabrication facilities can include a number of different photolithography tool groups that process a number of different layers for semiconductor substrates on which a number of different end-devices are to be formed. Different semiconductor substrates can be routed to different tool groups for photolithography irrespective of the end-device to be formed and irrespective of the layer to be formed. This routing can be due to different demands of the facility and down times of tool groups. This routing can result in a vast number of permutations of a layer of an end-device being formed using photolithography by a tool group. FIG. 1 diagrammatically illustrates routing of layers (e.g., Layers A, B, . . . , X) of types of end-devices (e.g., Devices A, B, . . . , X) to different tool groups (e.g., Tool A, B, . . . , X). The end-devices can be integrated circuits (ICs) formed by the processing. Due to the number of permutations, the data available for forecasting an energy condition based on a previous same layer of a same type of end-device by a same tool group can be limited. The limited data can make any forecast imprecise or incorrect. The difficulty can be exacerbated by a relatively long time period between acquisition of the data and the forecasted processing since intervening processing can result in additional variation that is not reflected by the data.

Examples described herein can address this difficulty by implementing one or more algorithms that permit consideration of an expanded data set to forecast a process condition, such as an energy condition. By using such additional data, variation in respective layers that are formed in end-devices of a given type can be reduced, thereby increasing yield of that type of end-device. Additionally, some examples described herein implement such algorithms in an automated process (e.g., by one or more processor-based systems), which can reduce down time of a semiconductor fabrication facility and work hours that would be required if the algorithms were implemented by an engineer alone (if such would be possible or feasible).

Figure 2:
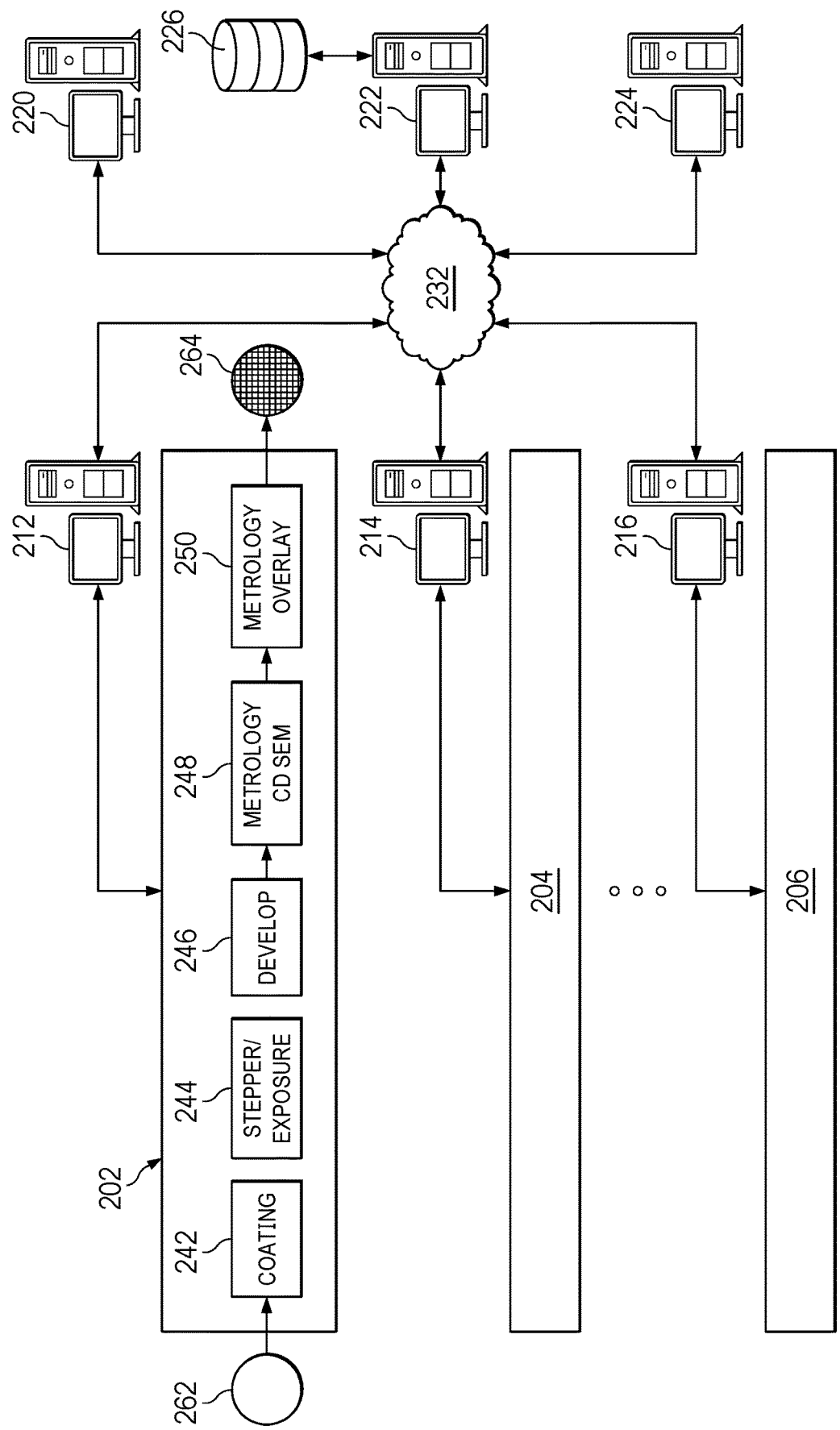
FIG. 2 is a diagram of a process control system according to some examples.

FIG. 2 is a diagram of a process control system according to some examples. The process control system includes tool groups 202, 204, 206. The tool group 202 includes a coating tool 242, a stepper/exposure tool 244, a developer tool 246, a critical dimension (CD) scanning electron microscope (SEM) metrology tool 248, and an overlay metrology tool 250. Tool groups 204, 206 likewise include like tools, although not specifically illustrated. The tool groups 202, 204, 206 are communicatively coupled to a respective one of the processor-based systems 212, 214, 216. The process control system further includes processor-based systems 220, 222, 224. The processor-based system 222 maintains a database 226. The processor-based systems 212, 214, 216, 220, 222, 224 are communicatively coupled together via a network 232. Each of the processor-based systems 212, 214, 216, 220, 222, 224 can be, for example, a computer, a server, or another processor-based system. The network 232 can be a wired network, wireless network, or a combination thereof and may be or include an intranet, a local area network (LAN), a wide area network (WAN), the Internet, or a combination thereof.

The processor-based system 220 can serve as a user interface by which recipes and tool settings are input to the process control system. Multiple recipes, such as one per a type of end-device to be fabricated for a number of types of end-devices, and corresponding tool settings can be input through the processor-based system 220. Appropriate photolithography recipes and tool settings for the types of end-devices are distributed to the processor-based systems 212-216 via the network 232. In some examples, the same photolithography recipes can be distributed to each tool group, different photolithography recipes can be distributed to different tool groups, or any combination therebetween. Each photolithography recipe can further be for forming a single layer of photo-sensitive material for fabricating a single type of end-device, or can include sub-recipes for forming different layers of photo-sensitive material for fabricating a single type of end-device.

The processor-based systems 212, 214, 216 control photolithography processes in the tool groups 202, 204, 206, respectively, based on the received photolithography recipes. Further, each processor-based system 212, 214, 216 implements an Advanced Process Control (APC) module for controlling the photolithography processes. Particularly, the APC modules of the processor-based systems 212, 214, 216 can control energy conditions of respective stepper/exposure tools.

In operation, a semiconductor substrate 262 (e.g., a wafer) is received at the tool group 202. A layer of photo-sensitive material is deposited on the semiconductor substrate 262 by the coating tool 242 (e.g., by spin coating). The semiconductor substrate 262 is transferred to the stepper/exposure tool 244, where areas (e.g., die areas) of the photo-sensitive material on the semiconductor substrate 262 are exposed to a pattern of light by sequentially stepping the semiconductor substrate 262 to an appropriate location and performing the exposure. The semiconductor substrate 262 is transferred to the developer tool 246, where the photo-sensitive material is developed. The semiconductor substrate 262 thereafter undergoes metrology measurements by the CD SEM metrology tool 248 and the overlay metrology tool 250. A semiconductor substrate 264 with a patterned photo-sensitive material thereon is output from the tool group 202 for subsequent processing, such as a plasma etch process.

The APC module operating on the processor-based system 212 receives the metrology data from the CD SEM metrology tool 248 and the overlay metrology tool 250. The APC module is configured to update, among other things, the energy condition of the stepper/exposure tool 244 based on variation of the metrology data from a target design of the layer that was measured. The APC module may be configured to update the energy condition on a lot-by-lot basis, in some examples. The processor-based system 212 communicates the energy condition for each lot, the layer, and type of end-device for which the energy condition was implemented to the processor-based system 222. The processor-based system 222 stores the energy condition, identification of the layer, identification of the type of end-device, identification of the tool, and a time period of the implemented photolithography process in the database 226. In some examples, an instance of a data object is created (hereinafter, an energy object for ease), where the instance includes an energy condition attribute, a layer identification attribute, a device type attribute, a tool identification attribute, and a time period attribute. In other examples, other data structures can be implemented. Object terminology is used herein for ease of reference, and any other coupling or relationship of attributes can be implemented. It is noted that similar processing and control by the tool groups 204, 206 and processor-based systems 214, 216 can occur.

The processor-based system 224 implements a control module for updating, among other things, process conditions, including energy conditions of photolithography processes. The control module of the processor-based system 224 accesses data stored in the database 226 via the network 232. The control module can update the energy conditions based on energy condition attributes of energy objects where the layer identification attributes, device type attributes, or tool identification attributes of the respective energy objects may vary between energy objects. Examples are described below. The control module can similarly update other process conditions. The control module can, after determining an energy condition, communicate the energy condition via the network 232 to the appropriate APC module of a respective processor-based system 212-216. The energy condition is then implemented by or used to set an energy condition by the APC module for subsequent photolithography processing by the respective tool group 202-206.

Various functionality generally described above and described in further detail below may be described with respect to a given module operating on a given processor-based system 212, 214, 216, 220, 222, 224. In various examples, any functionality may be implemented on any processor-based system. Some subset of functionality may be implemented on a single processor-based system or may be implemented distributed to multiple different processor-based systems. Different examples contemplate different functionality being performed by one or more processor-based systems or any combination of processor-based systems.

Figure 3:
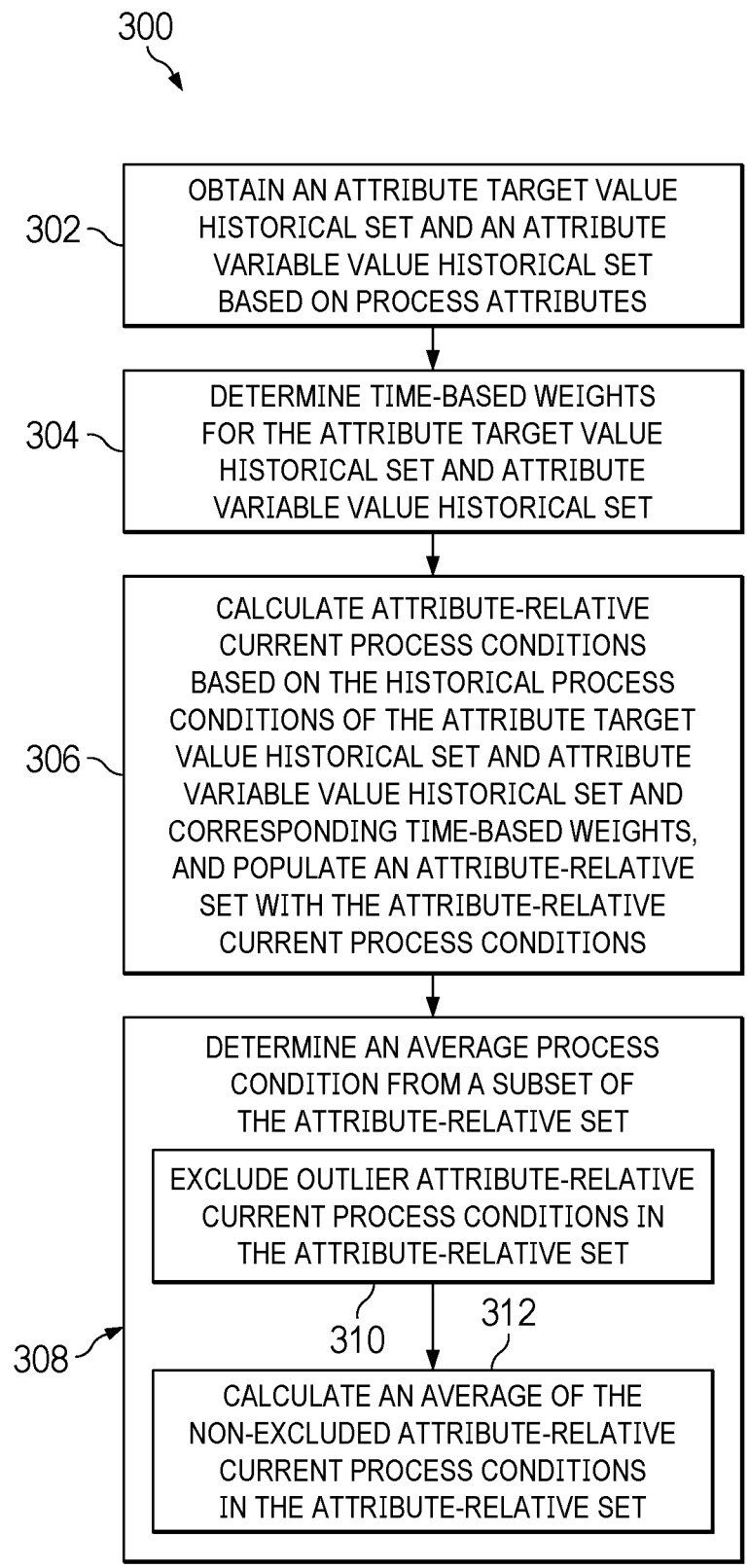
FIG. 3 is a flowchart of a method for determining a current process condition for forming an integrated circuit (IC) according to some examples.

FIG. 3 is a flowchart of a method 300 for determining a current process condition for forming an IC according to some examples. In some examples, the determined current process condition is a current energy condition (as in the described example below), and in other examples, the method 300 may be applied to other process conditions.

In some examples, energy objects stored in the database 226 are used in determining the current process condition (e.g., current energy condition). The energy condition attribute of an energy object is dependent on, in illustrative examples herein, at least the layer identification attribute, device type attribute, and tool identification attribute of that energy condition attribute. As used herein, a process attribute of an energy object includes an attribute of the energy object upon which the energy condition attribute depends and does not directly indicate time. According to illustrative examples herein, process attributes include the layer identification attribute, device type attribute, and tool identification attribute. In other examples, different process objects, or different data structures used to store appropriate data, may be implemented. In other examples, a process attribute can be or include an attribute that does not necessarily depend upon another attribute and does not directly indicate time.

For ease of reference, notations used below are outlined here.

y is a target value of a given process attribute;

x is a given variable value of the given process attribute;

X is a variable process attribute set containing all variable values of the given process attribute (x) except the target value of the given process attribute (y)(e.g., $x \in X$, $y \notin X$).

e(y) is a value of the current process condition for a semiconductor process (e.g., a photolithography process) for the target value of the given process attribute (y);

e(x) is a value of the current process condition for a semiconductor process for a given variable value of the given process attribute (x);

$P_i$ is a time period (e.g., a value of a time period attribute of an energy object);

$e_{pi}(y)$ is a value of a historical process condition for a semiconductor process (e.g., a value of an energy condition attribute of an energy object), at a time period ($P_i$), for the target value of the given process attribute (y);

$E_{ypi}$ is a historical set of values of historical process conditions ($e_{pi}(y)$) for time periods ($P_i$)(e.g., $e_{pi}(y) \in E_{ypi}$);

$e_{pi}(x)$ is a value of a historical process condition for a semiconductor process (e.g., a value of an energy condition attribute of an energy object), at a time period ($P_i$), for a given variable value of the given process attribute (x);

$E_{xpi}$ is a historical set of values of historical process conditions ($e_{pi}(x)$) for time periods ($P_i$) for the variable values of the given process attribute (x)(e.g., $e_{pi}(x) \in E_{xpi}$, $\forall x \in X$);

$w_{pi}$ is a time-based weight for a time period ($P_i$);

e(y|x) is an attribute-relative current process condition calculated for the target value of the given process attribute (y) based on a given variable value of the given process attribute (x);

$E_y$ is an attribute-relative set of attribute-relative current process conditions (e(y|x)) based on the variable values of the given process attribute (x)(e.g., $e(y|x) \in E_y$, $\forall x \in X$);

$\overline{E_y}$ is a calculated average of the attribute-relative current process conditions (e(y|x)) in the attribute-relative set ($E_y$);

$\sigma_{Ey}$ is a calculated standard deviation of the attribute-relative current process conditions (e(y|x)) in the attribute-relative set ($E_y$);

$E_{2\sigma y}$ is a two-sigma attribute-relative set of attribute-relative current process conditions (e(y|x)) in the attribute-relative set ($E_y$) that are within a range of two times the standard deviation ($\sigma_{Ey}$) from the average ($\overline{E_y}$); and $\overline{E_{2\sigma y}}$ is a calculated average of the attribute-relative current process conditions (e(y|x)) in the two-sigma attribute-relative set ($E_{2\sigma y}$).

Referring to FIG. 3, at block 302, an attribute target value historical set ($E_{ypi}$) and an attribute variable value historical set ($E_{xpi}$) are obtained (e.g., from energy objects) based on process attributes. With respect to the described energy objects, the attribute target value historical set ($E_{ypi}$) is populated by energy objects that have values of the respective process attributes that are equal to the values of the process attributes for the current process condition to be determined. The attribute variable value historical set ($E_{xpi}$) is populated by energy objects that have values of the respective process attributes that are equal to the values of the process attributes for the current process condition to be determined, except for the given process attribute. For example, with reference to FIG. 1, assume that the current process condition e(y) to be determined is for forming Layer A in type of Device A by Tool A, and that the given process attribute is the device type attribute. Under such assumptions, the attribute target value historical set ($E_{ypi}$) is populated by energy objects for which the values of the layer identification attribute, device type attribute, and tool identification attribute are Layer A, Device A, and Tool A, respectively, and the attribute variable value historical set ($E_{xpi}$) is populated by energy objects for which the values of the layer identification attribute and tool identification attribute are Layer A and Tool A, respectively, and the value of the device type attribute can be any of Device B through Device X.

At block 304, time-based weights ($w_{pi}$) are determined for the historical sets ($E_{ypi}$, $E_{xpi}$). The time-based weights ($w_{pi}$) are determined based on a function of time and are positive values, and the sum of the time-based weights ($w_{pi}$) equals one (e.g., $1 = \Sigma_{i=1}^{n} w_{pi}$, where n is the number of time-corresponding elements in the historical sets ($E_{ypi}$, $E_{xpi}$)). In some examples, nearer-in-time weights have a greater magnitude than further-in-time weights. In some examples, the function of time used to determine the time-based weights ($w_{pi}$) is an exponential decay function, such as $w_{pi} = c_1(1 - c_2)^{P_i}$. Time period ($P_i$), in this example, is a positive number indicating the time from the current process condition (e(y)), and $c_1$ and $c_2$ are coefficients such that any constraint, such as the sum of the time-based weights ($w_{pi}$) being equal to one, is satisfied. FIG. 4 is a graph illustrating example time-based weights ($w_{pi}$) for time periods P1, P2, P3, P4, and P5 according to some examples. The graph shows time-based weights ($w_{pi}$) based on an exponential decay function.

In some examples, different sets of time-based weights ($w_{pi}$) can be determined, where each set of time-based weights ($w_{pi}$) is for time-corresponding pairs of a historical process condition of the attribute target value historical set ($E_{ypi}$) and a historical process condition of the attribute variable value historical set ($E_{xpi}$) that corresponds to a respective value of the variable values of the given process attribute (x). For example, continuing the specific example above, a set of time-based weights ($w_{pi}$) may be determined for time-corresponding pairs of a historical process condition based on Device A and a historical process condition based on Device B, and another set of time-based weights ($w_{pi}$) may be determined for time-corresponding pairs of a historical process condition based on Device A and a historical process condition based on Device X.

Referring back to FIG. 3, at block 306, attribute-relative current process conditions (e(y|x)) are calculated based on the historical process conditions ($e_{pi}(y)$, $e_{pi}(x)$) of the historical sets ($E_{ypi}$, $E_{xpi}$) and corresponding time-based weights ($w_{pi}$), and populate an attribute-relative set ($E_y$). In some examples, the value of an attribute-relative current process condition (e(y|x)) is the value of the current process condition (e(x)) plus the sum of the weighted differences between values of time-corresponding pairs of historical process conditions ($e_{pi}(y)$) of the attribute target value historical set ($E_{ypi}$) and historical process conditions ($e_{pi}(x)$) of the attribute variable value historical set ($E_{xpi}$). An attribute-relative current process condition (e(y|x)) is calculated relative to each variable value of the given process attribute (x) in the variable process attribute set (X). This is shown by Equation (1) below.

$$e(y|x)=e(x)+\Sigma_{i=1}^{n} w_{pi}(e_{pi}(y)-e_{pi}(x)), \forall x \in X \quad \text{Eq. (1)}$$

At block 308, an average process condition is determined from a subset of the attribute-relative set ($E_y$). In some examples, block 308 includes blocks 310 and 312. At block 310, outlier attribute-relative current process conditions (e(y|x)) in the attribute-relative set ($E_y$) are excluded. In some examples, the average ($\overline{E_y}$) and standard deviation ($\sigma_{Ey}$) of the attribute-relative set ($E_y$) are calculated. Attribute-relative current process conditions (e(y|x)) in the attribute-relative set ($E_y$) that are outside of the range from the average ($\overline{E_y}$) minus two times the standard deviation ($\sigma_{Ey}$) (e.g., $\overline{E_y}-2\sigma_{Ey}$) to the average ($\overline{E_y}$) plus two times the standard deviation ($\sigma_{Ey}$)(e.g., $\overline{E_y}+2\sigma_{Ey}$) are excluded in some examples. The two-sigma attribute-relative set ($E_{2\sigma y}$) includes the non-excluded attribute-relative current process conditions (e(y|x)) from the attribute-relative set ($E_y$) and does not include excluded attribute-relative current process conditions (e(y|x)). In this example, the two-sigma attribute-relative set ($E_{2\sigma y}$) is a proper subset of the attribute-relative set ($E_y$)(($E_{2\sigma y} \subsetneq E_y$)). In some cases, no data is excluded, e.g., when no data points meet the condition for exclusion. In such cases, a subset may be a "non-strict" subset such that the subset includes each attribute-relative current process condition (e(y|x)) of the attribute-relative set ($E_y$)(($E_{2\sigma y}$= $E_y$)).

At block 312, an average ($\overline{E_{2\sigma y}}$) of the attribute-relative current process conditions (e(y|x)) in the two-sigma attribute-relative set ($E_{2\sigma y}$) is calculated. The average ($\overline{E_{2\sigma y}}$) is the average process condition of block 308 and is the determined current process condition (e(y)).

Method 1

In some examples, hereinafter referred to as "Method 1", the given process attribute in the context of the method 300 of FIG. 3 is the device type attribute. In Method 1, a current process condition (e(y))(e.g., energy condition) of a photolithography exposure is for forming a target layer (having a first target value of the layer identification attribute) in a target end-device type (having a second target value of the device type attribute) by a target tool (having a third target value of the tool identification attribute). The target value of the device type attribute (y) is the second target value, and the variable process attribute set (X) includes other values (e.g., not the second target value) of the device type attribute (x).

At block 302, the attribute target value historical set ($E_{ypi}$) is populated by energy objects that have the layer identification attribute, the device type attribute, and the tool identification attribute equal to the first target value, the second target value, and the third target value, respectively. The attribute variable value historical set ($E_{xpi}$) is populated by energy objects that have the layer identification attribute and the tool identification attribute equal to the first target value and the third target value, respectively, and that have the device type attribute equal to any variable value in the variable process attribute set (X).

As an example, with reference to FIG. 1, assume that the current process condition e(y) to be determined is for forming Layer A in type of Device A by Tool A. The attribute target value historical set ($E_{ypi}$) is populated by energy objects where the values of the layer identification attribute, device type attribute, and tool identification attribute are Layer A, Device A (e.g., y=Device A), and Tool A, respectively. The attribute variable value historical set ($E_{xpi}$) is populated by energy objects where the values of the layer identification attribute and tool identification attribute are Layer A and Tool A, respectively, and the value of the device type attribute can be any of Device B through Device X (e.g., X={Device B, . . . , Device X}). Other permutations of values for the layer identification attribute, device type attribute, and tool identification attribute can be implemented to determine other current process conditions.

Blocks 304-308 can be performed as described above to obtain the current process condition (e(y)).

Method 2

In some examples, hereinafter referred to as "Method 2", the given process attribute in the context of the method 300 of FIG. 3 is the layer identification attribute. In Method 2, a current process condition (e(y))(e.g., energy condition) of a photolithography exposure is for forming a target layer (having a first target value of the layer identification attribute) in a target end-device type (having a second target value of the device type attribute) by a target tool (having a third target value of the tool identification attribute). The target value of the layer identification attribute (y) is the first target value, and the variable process attribute set (X) includes other values (e.g., not the first target value) of the layer identification attribute (x).

At block 302, the attribute target value historical set ($E_{ypi}$) is populated by energy objects that have the layer identification attribute, the device type attribute, and the tool identification attribute equal to the first target value, the second target value, and the third target value, respectively. The attribute variable value historical set ($E_{xpi}$) is populated by energy objects that have the device type attribute and the tool identification attribute equal to the second target value and the third target value, respectively, and that have the layer identification attribute equal to any variable value in the variable process attribute set (X).

As an example, with reference to FIG. 1, assume that the current process condition e(y) to be determined is for forming Layer A in type of Device A by Tool A. The attribute target value historical set ($E_{ypi}$) is populated by energy objects where the values of the layer identification attribute, device type attribute, and tool identification attribute are Layer A (e.g., y=Layer A), Device A, and Tool A, respectively. The attribute variable value historical set ($E_{xpi}$) is populated by energy objects where the values of the layer identification attribute and tool identification attribute are Device A and Tool A, respectively, and the value of the layer identification attribute can be any of Layer B through Layer X (e.g., X={Layer B, . . . , Layer X}). Other permutations of values for the layer identification attribute, device type attribute, and tool identification attribute can be implemented to determine other current process conditions.

Blocks 304-308 can be performed as described above to obtain the current process condition (e(y)).

Method 3

In some examples, hereinafter referred to as "Method 3", the given process attribute in the context of the method 300 of FIG. 3 is the tool identification attribute. In Method 3, a current process condition (e(y))(e.g., energy condition) of a photolithography exposure is for forming a target layer (having a first target value of the layer identification attribute) in a target end-device type (having a second target value of the device type attribute) by a target tool (having a third target value of the tool identification attribute). The target value of the tool identification attribute (y) is the third target value, and the variable process attribute set (X) includes other values (e.g., not the third target value) of the tool identification attribute (x).

At block 302, the attribute target value historical set ($E_{ypi}$) is populated by energy objects that have the layer identification attribute, the device type attribute, and the tool identification attribute equal to the first target value, the second target value, and the third target value, respectively. The attribute variable value historical set ($E_{xpi}$) is populated by energy objects that have the layer identification attribute and the device type attribute equal to the first target value and the second target value, respectively, and that have the tool identification attribute equal to any variable value in the variable process attribute set (X).

As an example, with reference to FIG. 1, assume that the current process condition e(y) to be determined is for forming Layer A in type of Device A by Tool A. The attribute target value historical set ($E_{ypi}$) is populated by energy objects where the values of the layer identification attribute, device type attribute, and tool identification attribute are Layer A, Device A, and Tool A (e.g., y=Tool A), respectively. The attribute variable value historical set ($E_{xpi}$) is populated by energy objects where the values of the layer identification attribute and the device type attribute are Layer A and Device A, respectively, and the value of the tool identification attribute can be any of Tool B through Tool X (e.g., X={Tool B, . . . , Tool X}). Other permutations of values for the layer identification attribute, device type attribute, and tool identification attribute can be implemented to determine other current process conditions.

Blocks 304-308 can be performed as described above to obtain the current process condition (e(y)).

Figure 5B:
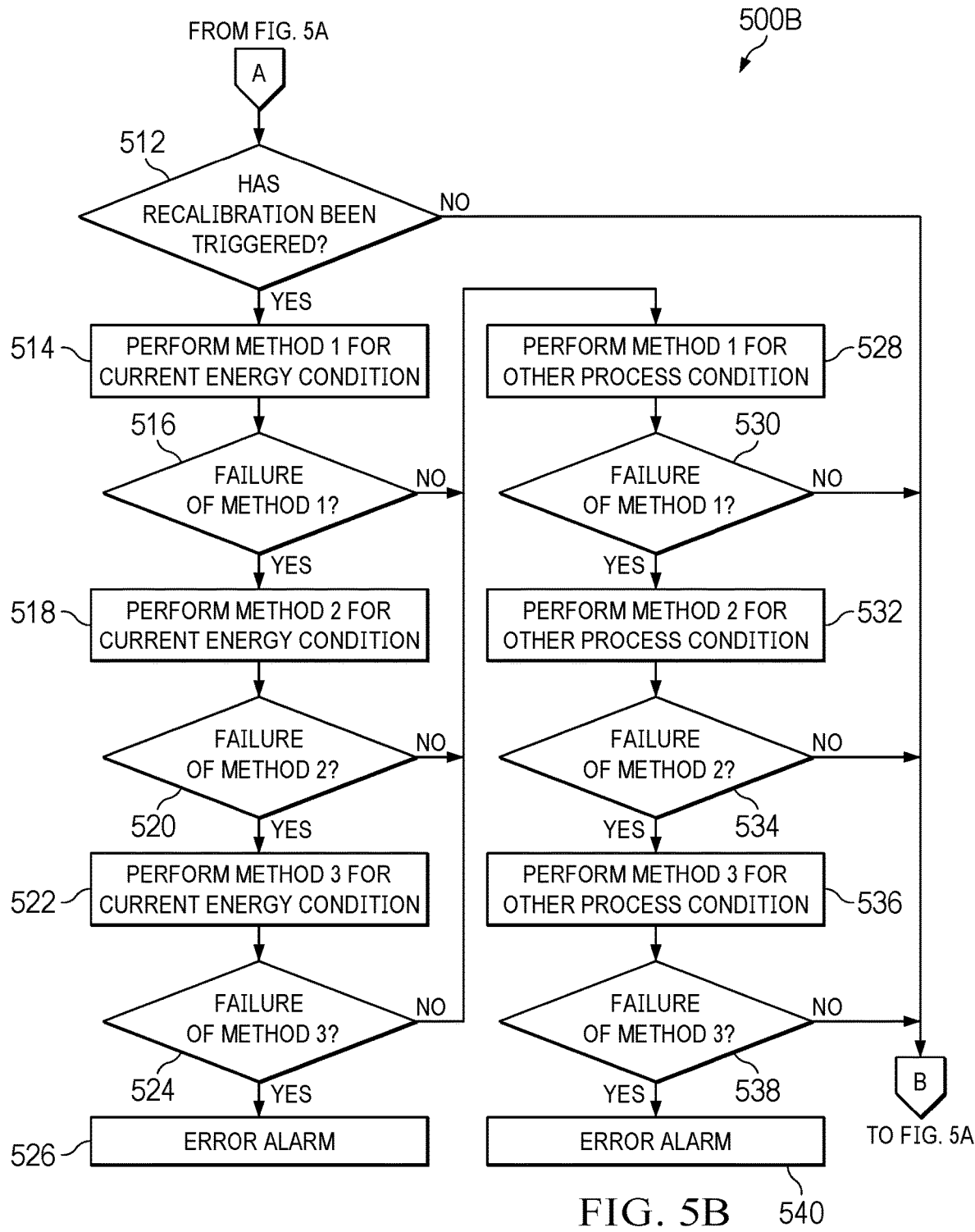

FIGS. 5A and 5B are a flow chart of a method 500A, 500B for updating process conditions for forming ICs according to some examples. While described in the context of photolithography in a semiconductor manufacturing flow, the method 500A, 500B can be adapted to other processes in a semiconductor process flow, e.g., material deposition or etch. Furthermore the method 500A, 500B can be adapted to other non-semiconductor manufacturing contexts that involve analogous groupings of products, manufacturing tools, and incremental production steps. At block 502, process conditions are set for one or more tool groups. At least some of the process conditions are for photolithography processes for forming the ICs. A photolithography process can have process conditions set initially according to a photolithography recipe for an IC. Each tool group can be set according to one or more photolithography recipe. Each photolithography recipe can be for patterning a given layer of photo-sensitive material on a semiconductor substrate on which a given type of end-device is to be fabricated. With reference to FIG. 2, the process conditions, or recipes, can be input via a user interface (UI) operating on the processor-based system 220. The UI operating on the processor-based system 220 can then communicate or distribute appropriate one or more photolithography recipes to one or more of the respective APC modules operating on the processor-based systems 212, 214, 216. The respective APC modules operating on the processor-based systems 212, 214, 216 can implement the process conditions to thereby set the process conditions for the respective tool groups 202, 204, 206.

Referring back to FIGS. 5A and 5B, at block 504, the one or more tool groups process respective one or more lots of semiconductor substrates based on the process conditions that were set. For a tool group performing a photolithography process on a lot, a layer of photo-sensitive material is deposited (e.g., by coating tool 242), exposed (e.g., by stepper/exposure tool 244), and developed (e.g., by developer tool 246) on respective semiconductor substrates of a lot according to the photolithography recipe for that layer and type of end-device that the lot of semiconductor substrates is used to fabricate.

At block 506, metrology is performed on the semiconductor substrates. The metrology is performed on each semiconductor substrate after that semiconductor substrate has undergone the photolithography processing. For example, each semiconductor substrate that undergoes photolithography processing at a tool group 202, 204, 206 has the resulting patterned layer of photo-sensitive material measured by metrology (e.g., by CD SEM metrology tool 248 and by overlay metrology tool 250).

At block 508, process conditions are tuned based on the metrology results. With respect to block 508, process conditions for the tool group with respect to the layer of photo-sensitive material that was processed and with respect to the type of end-device that is fabricated from the semiconductor substrate are tuned based on the metrology results. Process conditions for a subsequent photolithography process in a tool for a layer used for fabricating a type of end-device are tuned based on metrology results measured from a photolithography process in the same tool for the same layer for fabricating the same type of end-device. With reference to FIG. 2, the APC module operating on the respective processor-based system 212, 214, 216 receives the metrology results from the CD SEM metrology tool 248 and the overlay metrology tool 250 and tunes the process conditions based on a comparison of the metrology results with a target design of the photolithography recipe.

Referring back to FIGS. 5A and 5B, at block 510, the tuned process conditions are stored in a database as historical process conditions. As described previously, the process conditions for a photolithography process can be stored as an energy object that includes values for the energy condition attribute, the tool identification attribute, the device type attribute, and the layer identification attribute. With reference to FIG. 2, the APC module operating on the respective processor-based system 212, 214, 216 communicates the process conditions, via the network 232, to a database module operating on the processor-based system 222, which stores and maintains the process conditions (e.g., as an energy object) in the database 226.

Referring back to FIGS. 5A and 5B, at block 512, a determination is made whether a recalibration of process conditions has been triggered. The recalibration process can be triggered based on a predetermined duration of time elapsing from the initial setting of process conditions or from the previous recalibration of process conditions. For example, recalibration can be triggered every two hours or a different duration. Other circumstances can cause the recalibration to be triggered. With reference to FIG. 2, the control module operating on the processor-based system 224 determines when recalibration has been triggered. If recalibration has not been triggered, the tuned process conditions are used to set the process conditions in block 502, and blocks 502-512 reiterate.

If recalibration has been triggered, process conditions are recalibrated according to blocks 514-540. With reference to FIG. 2, if the control module operating on the processor-based system 224 determines that recalibration has been triggered, the control module operating on the processor-based system 224 may send, via the network 232, an interrupt signal to the APC modules operating on the processor-based systems 212, 214, 216 for the respective tool group 202, 204, 206 to not begin processing another lot of semiconductor substrates (e.g., and may conclude processing of any currently processed lot).

Referring back to FIGS. 5A and 5B, recalibration of an energy condition is performed at blocks 514-526. At block 514, Method 1, as described above, is performed to determine the energy condition (e.g., the process condition). At block 516, a determination is made whether a failure of Method 1 occurred. If not, the energy condition has been determined for the recalibration. If a failure of Method 1 occurred, at block 518, Method 2, as described above, is performed to determine the energy condition. At block 520, a determination is made whether a failure of Method 2 occurred. If not, the energy condition has been determined for the recalibration. If a failure of Method 2 occurred, at block 522, Method 3, as described above, is performed to determine the energy condition. At block 524, a determination is made whether a failure of Method 3 occurred. If not, the energy condition has been determined for the recalibration. If a failure of Method 3 occurred, at block 526, an error alarm is triggered.

For performing Methods 1, 2, or 3 at blocks 514, 518, 522, the control module operating on the processor-based system 224 accesses the historical process conditions stored in the database 226 via the network 232. The control module operating on the processor-based system 224 can then perform Methods 1, 2, and/or 3 to determine the energy condition. A failure of Method 1, 2, or 3 may occur when insufficient data is available for performing the respective method, for example. A failure of Method 1, 2, or 3 may occur when calculated attribute-relative current process conditions are sufficiently separated such that a significant number of the attribute-relative current process conditions are excluded at block 310, for example. The recalibration of an energy condition can be for an energy condition for any permutation of tool group, layer, and type of end-device. In some examples, the recalibration occurs for each permutation of tool group, layer, and type of end-device that may occur within the subject semiconductor fabrication facility.

If no failure occurs at blocks 516, 520, 524, recalibration of one or more other process conditions can occur. In some examples, recalibration of other process conditions can be omitted. Recalibration of one or more other process conditions is performed at blocks 528-540. Recalibration in blocks 528-540 is described with respect to one process condition, although blocks 528-540 can be performed for multiple process conditions.

At block 528, Method 1, as described above, is performed to determine the process condition. At block 530, a determination is made whether a failure of Method 1 occurred. If not, the process condition has been determined for the recalibration. If a failure of Method 1 occurred, at block 532, Method 2, as described above, is performed to determine the process condition. At block 534, a determination is made whether a failure of Method 2 occurred. If not, the process condition has been determined for the recalibration. If a failure of Method 2 occurred, at block 536, Method 3, as described above, is performed to determine the process condition. At block 538, a determination is made whether a failure of Method 3 occurred. If not, the process condition has been determined for the recalibration. If a failure of Method 3 occurred, at block 540, an error alarm is triggered.

Like described previously, for performing Methods 1, 2, or 3 at blocks 528, 532, 536, the control module operating on the processor-based system 224 accesses corresponding historical process conditions stored in the database 226 via the network 232. The control module operating on the processor-based system 224 can then perform Methods 1, 2, and/or 3 to determine the process condition. Examples of other process conditions include scanner or stepper energy condition, scanner or stepper overlap correction condition, and overlap correction condition, including translation, rotation, magnification, asymmetric rotation, and asymmetric magnification. A failure of Method 1, 2, or 3 may occur when insufficient data is available for performing the respective method, for example. A failure of Method 1, 2, or 3 may occur when calculated attribute-relative current process conditions are sufficiently separated such that a significant number of the attribute-relative current process conditions are excluded at block 310, for example.

After the recalibration is performed (e.g., blocks 514-526 and/or blocks 528-540), the energy condition and/or other process condition(s) are used to set process conditions of a corresponding tool group at block 502 for subsequent processing. Then, subsequent processing is performed at block 504, as described previously.

In implementing the above method 500A, 500B of FIGS. 5A and 5B, variation of fabricated end-devices has been reduced in a demonstrated test implementation in a semiconductor fabrication facility. For example, for a given layer for a type of end-device, X and Y direction overlay variation improved 65% and 25%, respectively. Additionally, X and Y scaling variation improved 62% and 13%, respectively. It is believed that such implementation can significantly reduce the amount of hold lots per month, the amount of in-line operator delay hours per year, the amount of engineer hours per year, and product cycle time. Variation based on pattern movement on the output wafer of photolithography area can also improve. Other benefits can be achieved.

Figure 6:
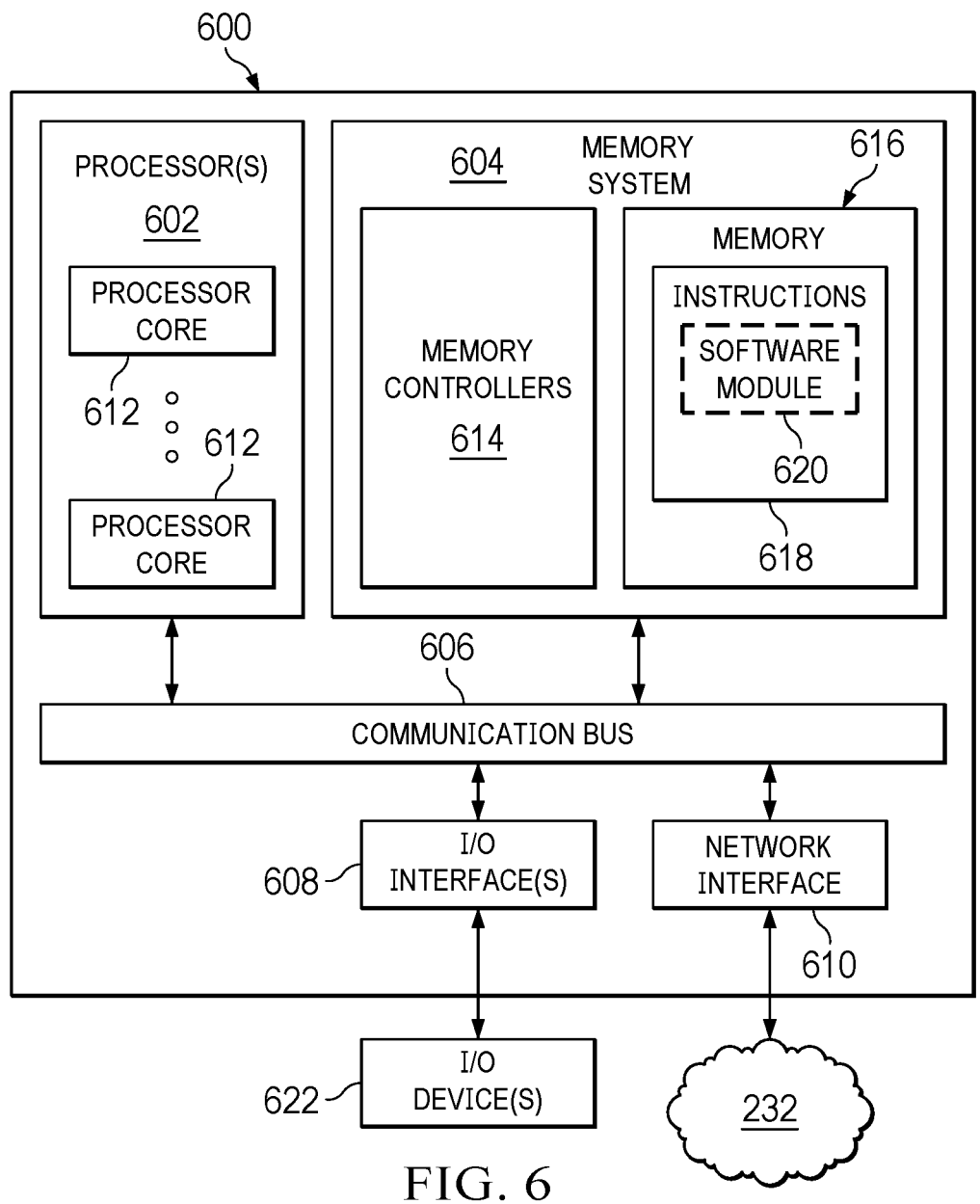
FIG. 6 is a diagram of a processor-based system according to some examples.

FIG. 6 illustrates a processor-based system 600 according to some examples. The processor-based system 600 may be implemented as any of the processor-based systems 212, 214, 216, 220, 222, 224. The processor-based system 600 may be a computer, a server, or other machine. The processor-based system 600 includes one or more processors 602, a memory system 604, a communication bus 606, one or more input/output (I/O) interfaces 608, and a network interface 610.

Each processor 602 can include one or more processor cores 612. Each processor 602 and/or processor core 612 may be, for example, a central processing unit (CPU), a reduced instruction set computing (RISC) processor, a complex instruction set computing (CISC) processor, a graphics processing unit (GPU), a digital signal processor (DSP), an application specific integrated circuit (ASIC), a field programmable gate array (FPGA), another processor, or any suitable combination thereof.

The memory system 604 includes one or more memory controllers 614 and memory 616. The memory controllers 614 are configured to control read and/or write access to a particular memory 616 or subset of memory 616. The memory 616 may include main memory, disk storage, or any suitable combination thereof. The memory 616 may include any type of volatile or nonvolatile memory, such as dynamic random access memory (DRAM), static random access memory (SRAM), erasable programmable read-only memory (EPROM), electrically erasable programmable read-only memory (EEPROM), Flash memory, solid-state storage, etc. The memory 616 is a non-transitory machine-readable or computer-readable storage medium. Instructions 618 are stored in the memory 616. The instructions 618 may be machine-executable code (e.g., machine code) and may comprise firmware, software, a program, an application, an applet, or other machine-executable code. The instructions 618 can, for example, depending on which of the processor-based systems 212, 214, 216, 220, 222, 224 is being implemented, embody a software module 620, such as an APC module, a control module, or database module, which when executed by the one or more processors 602, performs various functionality and methodologies as referenced above.

The one or more I/O interfaces 608 are configured to be electrically and/or communicatively coupled to one or more I/O devices 622. Example I/O devices 622 include a keyboard, a mouse, a display device, a printer, control circuits of tools, etc. The one or more I/O interfaces 608 can include connectors or coupling circuitry, such as a universal serial bus (USB) connection, a high-definition multimedia interface (HDMI) connection, Bluetooth® circuitry, or the like.

The network interface 610 is configured to be communicatively coupled to the network 232. The network interface 610 can include circuitry for wired communication, such as an Ethernet connection, and/or can include circuitry for wireless communication, such as a circuitry for Wi-Fi® communications.

The communication bus 606 is communicatively connected to the one or more processors 602, the memory system 604, the one or more I/O interfaces 608, and the network interface 610. The various components can communicate between each other via the communication bus 606. The communication bus 606 can control the flow of communications, such as by including an arbiter to arbitrate the communications.

Although various examples have been described in detail, it should be understood that various changes, substitutions, and alterations can be made therein without departing from the scope defined by the appended claims.

What is claimed is:

1. A method of forming an integrated circuit (IC), the method comprising:
    using one or more processor-based systems, obtaining first historical process conditions and second historical process conditions, wherein the first historical process conditions are of previous semiconductor processing corresponding to a target value of a process attribute for forming the IC, and the second historical process conditions are of previous semiconductor processing corresponding to variable values of the process attribute;
    using the one or more processor-based systems, calculating attribute-relative process conditions, each attribute-relative process condition of the attribute-relative process conditions being based on the first historical process conditions and the second historical process conditions that correspond to a respective given value of the variable values;
    using the one or more processor-based systems, determining an average process condition from a subset of the attribute-relative process conditions;
    setting a process condition of a subsequent semiconductor process based on the average process condition, the subsequent semiconductor process corresponding to the target value of the process attribute; and
    performing the subsequent semiconductor process on a semiconductor substrate, the subsequent semiconductor process being based on the set process condition.

2. The method of claim 1, further comprising determining time-based weights, each time-based weight of the time-based weights corresponding to a time-corresponding pair of a first historical process condition of the first historical process conditions and a second historical process condition of the second historical process conditions, wherein calculating the attribute-relative process conditions is further based on the time-based weights.

3. The method of claim 2, wherein nearer-in-time ones of the time-based weights for respective time-corresponding pairs have a greater magnitude than further-in-time ones of the time-based weights for respective time-corresponding pairs, the nearer-in-time ones and the further-in-time ones being time-relative to the subsequent semiconductor process.

4. The method of claim 2, wherein each attribute-relative process condition of the attribute-relative process conditions includes a sum of:
    (i) a current process condition corresponding to the respective given value; and
    (ii) a sum of weighted differences, wherein:
        each weighted difference of the weighted differences is a respective time-based weight of the time-based weights times a difference between a respective time-corresponding pair of the time-corresponding pairs; and
        for the respective time-corresponding pair, the second historical process condition corresponds to the respective given value.

5. The method of claim 1, wherein the subset of the attribute-relative process conditions is a proper subset.

6. The method of claim 5, further comprising determining the proper subset of the attribute-relative process conditions, determining the proper subset comprising:
    calculating an outlier-included average of the attribute-relative process conditions;
    calculating an outlier-included standard deviation of the attribute-relative process conditions; and
    excluding outlier attribute-relative process conditions of the attributed relative process condition, wherein the outlier attribute-relative process conditions are outside of a range of two times the outlier-included standard deviation from the outlier-included average, and wherein the proper subset includes non-excluded attribute relative process conditions of the attribute-relative process conditions.

7. The method of claim 1, wherein:
the previous semiconductor processing of the first historical process conditions include first photolithography processes performed by a same given tool for a same given layer on a semiconductor substrate for a same given type of end-device, wherein the target value of the process attribute is the given type of end-device; and
the previous semiconductor processing of the second historical process conditions include second photolithography processes performed by the same given tool for the same given layer on a semiconductor substrate for a different type of end-device, wherein the variable values of the process attribute include the different type of end-device.

8. The method of claim 1, wherein:
the previous semiconductor processing of the first historical process conditions include first photolithography processes performed by a same given tool for a same given layer on a semiconductor substrate for a same given type of end-device, wherein the target value of the process attribute is the given layer; and
the previous semiconductor processing of the second historical process conditions include second photolithography processes performed by the same given tool for a different layer on a semiconductor substrate for the same given type of end-device, wherein the variable values of the process attribute include the different layer.

9. The method of claim 1, wherein:
the previous semiconductor processing of the first historical process conditions include first photolithography processes performed by a same given tool for a same given layer on a semiconductor substrate for a same given type of end-device, wherein the target value of the process attribute is the given tool; and
the previous semiconductor processing of the second historical process conditions include second photolithography processes performed by a different tool for the same given layer on a semiconductor substrate for the same given type of end-device, wherein the variable values of the process attribute include the different tool.

10. A method of forming an integrated circuit, the method comprising:
using one or more processor-based systems, obtaining first historical energy conditions and second historical energy conditions, wherein the first historical energy conditions are of previous photolithography processing corresponding to a target value of a process attribute, and the second historical energy conditions are of previous photolithography processing corresponding to variable values of the process attribute;
using the one or more processor-based systems, determining time-based weights, each time-based weight of the time-based weights being for a time-corresponding pair of a first historical energy condition of the first historical energy conditions and a second historical energy condition of the second historical energy conditions;
using the one or more processor-based systems, calculating attribute-relative energy conditions, each attribute-relative energy condition of the attribute-relative energy conditions being based on the time-based weights, the first historical energy conditions, and the second historical energy conditions that correspond to a respective given value of the variable values of the process attribute;
using the one or more processor-based systems, excluding outlier attribute-relative energy conditions of the attribute-relative energy conditions;
using the one or more processor-based systems, determining an average energy condition from non-excluded attribute-relative energy conditions of the attribute-relative energy conditions;
setting an energy condition of a subsequent photolithography process based on the average energy condition, the subsequent photolithography process corresponding to the target value of the process attribute; and
performing the subsequent photolithography process on a semiconductor substrate, the subsequent photolithography process being based on the set energy condition.

11. The method of claim 10, wherein nearer-in-time ones of the time-based weights for respective time-corresponding pairs have a greater magnitude than further-in-time ones of the time-based weights for respective time-corresponding pairs, the nearer-in-time ones and the further-in-time ones being time-relative to the subsequent photolithography process.

12. The method of claim 10, wherein each attribute-relative energy condition of the attribute-relative energy conditions is a current energy condition corresponding to the respective given value of the variable values of the process attribute plus a sum of weighted differences, each weighted difference of the weighted differences being a respective time-based weight of the time-based weights times a difference between a respective time-corresponding pair of the time-corresponding pairs, wherein for the respective time-corresponding pair, the second historical energy condition corresponds to the respective given value of the variable values of the process attribute.

13. The method of claim 10, wherein:
the previous photolithography processing of the first historical energy conditions include first photolithography processes performed by a same given tool for a same given layer on a semiconductor substrate for a same given type of end-device, wherein the target value of the process attribute is the given type of end-device; and
the previous photolithography processing of the second historical energy conditions include second photolithography processes performed by the same given tool for the same given layer on a semiconductor substrate for a different type of end-device, wherein the variable values of the process attribute include the different type of end-device.

14. The method of claim 10, wherein:
the previous photolithography processing of the first historical energy conditions include first photolithography processes performed by a same given tool for a same given layer on a semiconductor substrate for a same given type of end-device, wherein the target value of the process attribute is the given layer; and
the previous photolithography processing of the second historical energy conditions include second photolithography processes performed by the same given tool for a different layer on a semiconductor substrate for the same given type of end-device, wherein the variable values of the process attribute include the different layer.

15. The method of claim 10, wherein:
the previous photolithography processing of the first historical energy conditions include first photolithography processes performed by a same given tool for a same given layer on a semiconductor substrate for a same given type of end-device, wherein the target value of the process attribute is the given tool; and the previous photolithography processing of the second historical energy conditions include second photolithography processes performed by a different tool for the same given layer on a semiconductor substrate for the same given type of end-device, wherein the variable values of the process attribute include the different tool.

16. A non-transitory computer readable medium comprising stored instructions, which when executed by one or more processors, cause the one or more processors to:

obtain first historical process conditions and second historical process conditions from a database, wherein the first historical process conditions are of previous semiconductor processing corresponding to a target value of a process attribute, and the second historical process conditions are of previous semiconductor processing corresponding to variable values of the process attribute;

determine time-based weights, each time-based weight of the time-based weights being for a time-corresponding pair of a first historical process condition of the first historical process conditions and a second historical process condition of the second historical process conditions;

calculate attribute-relative process conditions, each attribute-relative process condition of the attribute-relative process conditions being a current process condition corresponding to a respective given value of the variable values of the process attribute plus a sum of weighted differences, each weighted difference of the weighted differences being a respective time-based weight of the time-based weights times a difference between a respective time-corresponding pair of the time-corresponding pairs, wherein for the respective time-corresponding pair, the second historical process condition corresponds to the respective given value of the variable values of the process attribute;

exclude outlier attribute-relative process conditions of the attribute-relative process conditions; and determine an average process condition from non-excluded attribute-relative process conditions of the attribute-relative process conditions, wherein the average process condition is for a subsequent semiconductor process corresponding to the target value of the process attribute.

17. The non-transitory computer readable medium of claim 16, wherein, when the instructions are executed by the one or more processors, excluding the outlier attribute-relative process conditions includes:

calculating an outlier-included average of the attribute-relative process conditions; and calculating an outlier-included standard deviation of the attribute-relative process conditions, wherein the outlier attribute-relative process conditions are outside of a range of two times the outlier-included standard deviation from the outlier-included average.

18. The non-transitory computer readable medium of claim 16, wherein:

the previous semiconductor processing of the first historical process conditions include first photolithography processes performed by a same given tool for a same given layer on a semiconductor substrate for a same given type of end-device, wherein the target value of the process attribute is the given type of end-device; and the previous semiconductor processing of the second historical process conditions include second photolithography processes performed by the same given tool for the same given layer on a semiconductor substrate for a different type of end-device, wherein the variable values of the process attribute include the different type of end-device.

19. The non-transitory computer readable medium of claim 16, wherein:

the previous semiconductor processing of the first historical process conditions include first photolithography processes performed by a same given tool for a same given layer on a semiconductor substrate for a same given type of end-device, wherein the target value of the process attribute is the given layer; and the previous semiconductor processing of the second historical process conditions include second photolithography processes performed by the same given tool for a different layer on a semiconductor substrate for the same given type of end-device, wherein the variable values of the process attribute include the different layer.

20. The non-transitory computer readable medium of claim 16, wherein:

the previous semiconductor processing of the first historical process conditions include first photolithography processes performed by a same given tool for a same given layer on a semiconductor substrate for a same given type of end-device, wherein the target value of the process attribute is the given tool; and the previous semiconductor processing of the second historical process conditions include second photolithography processes performed by a different tool for the same given layer on a semiconductor substrate for the same given type of end-device, wherein the variable values of the process attribute include the different tool.

* * * * *